(12) United States Patent
Kuniya

(10) Patent No.: US 7,986,001 B2
(45) Date of Patent: Jul. 26, 2011

(54) SEMICONDUCTOR MEMORY DEVICE AND METHOD OF MANUFACTURING THE SAME

(75) Inventor: Takuji Kuniya, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/275,944

(22) Filed: Nov. 21, 2008

(65) Prior Publication Data

US 2009/0140315 A1    Jun. 4, 2009

(30) Foreign Application Priority Data

Nov. 22, 2007   (JP) .................................. 2007-303640

(51) Int. Cl.
*H01L 29/788*   (2006.01)
(52) U.S. Cl. ................ 257/315; 257/E29.129
(58) Field of Classification Search .................. 257/202, 257/315, 390, 391, E27.103, E29.128, E29.129, 257/E29.3, E29.304
See application file for complete search history.

(56) References Cited

U.S. PATENT DOCUMENTS

| | | | | |
|---|---|---|---|---|
| 6,835,978 B2 * | 12/2004 | Matsui et al. | ................ | 257/316 |
| 6,953,965 B2 * | 10/2005 | Goda et al. | .................... | 257/316 |
| 2002/0158273 A1 * | 10/2002 | Satoh et al. | .................... | 257/211 |
| 2006/0244018 A1 * | 11/2006 | Kutsukake et al. | ........... | 257/288 |
| 2007/0040210 A1 | 2/2007 | Matsunaga | | |
| 2007/0176224 A1 * | 8/2007 | Yaegashi | ....................... | 257/315 |
| 2007/0275519 A1 | 11/2007 | Choi | | |
| 2008/0048243 A1 * | 2/2008 | Morikado | ....................... | 257/316 |
| 2008/0185630 A1 | 8/2008 | Aoyama et al. | | |

FOREIGN PATENT DOCUMENTS

JP    2005-228868    8/2005

OTHER PUBLICATIONS

Omura et al., U.S. Appl. No. 12/244,523, filed Oct. 2, 2008, entitled "Semiconductor Memory Device and Method of Manufacturing the Same".

* cited by examiner

*Primary Examiner* — Minh-Loan T Tran
*Assistant Examiner* — Vongsavanh Sengdara
(74) *Attorney, Agent, or Firm* — Finnegan, Henderson, Farabow, Garrett & Dunner, L.L.P.

(57) ABSTRACT

A semiconductor memory device comprises: a plurality of transistors having a stacked-gate structure, each transistor including a semiconductor substrate, a gate insulator formed on the semiconductor substrate, a lower gate formed on the semiconductor substrate with the gate insulator interposed, an intergate insulator formed on the lower gate, and an upper gate formed and silicided on the lower gate with the intergate insulator interposed. A portion of the transistors has an aperture formed through the intergate insulator to connect the lower gate with the upper gate and further includes a silicide suppression region between the aperture and the gate insulator to suppress diffusion of metal atoms from the silicided upper gate.

14 Claims, 17 Drawing Sheets

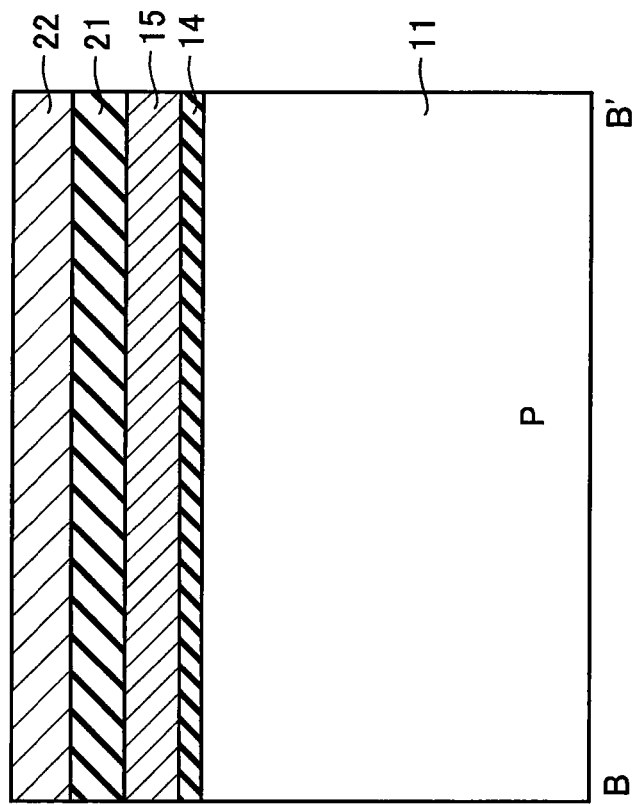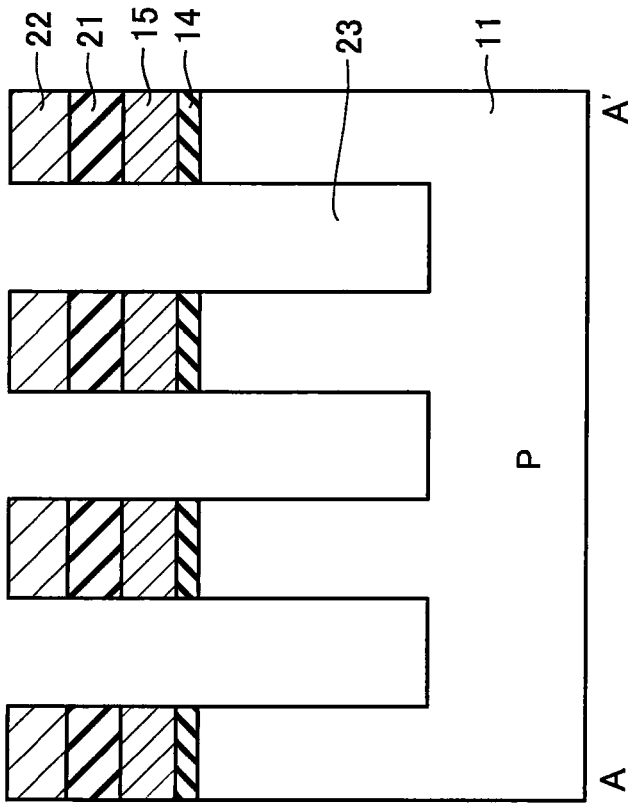

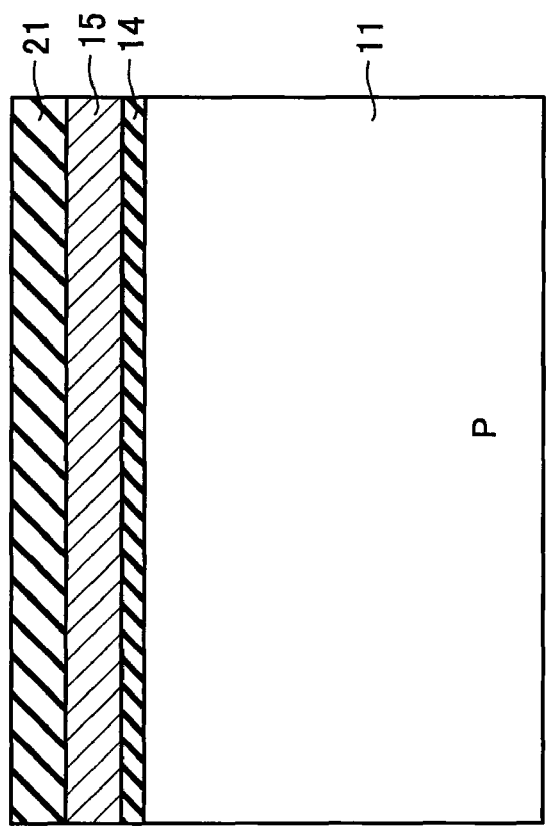
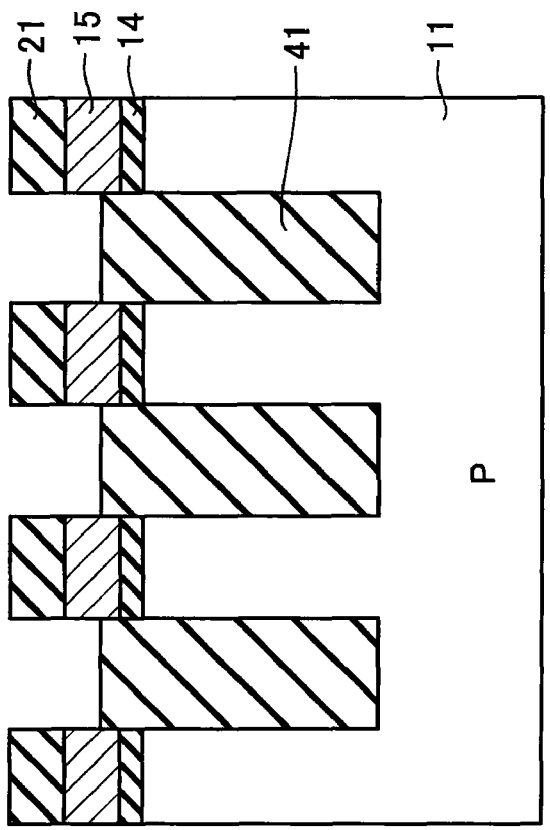

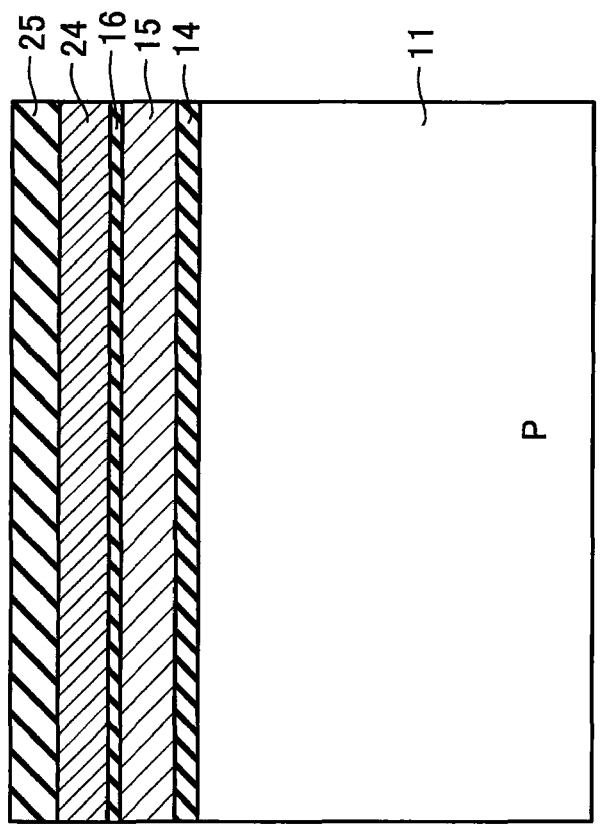
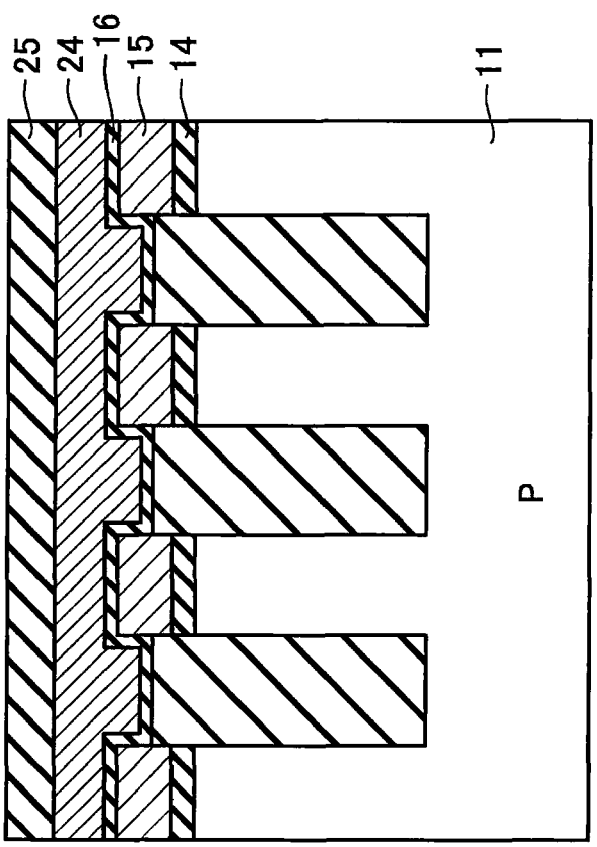

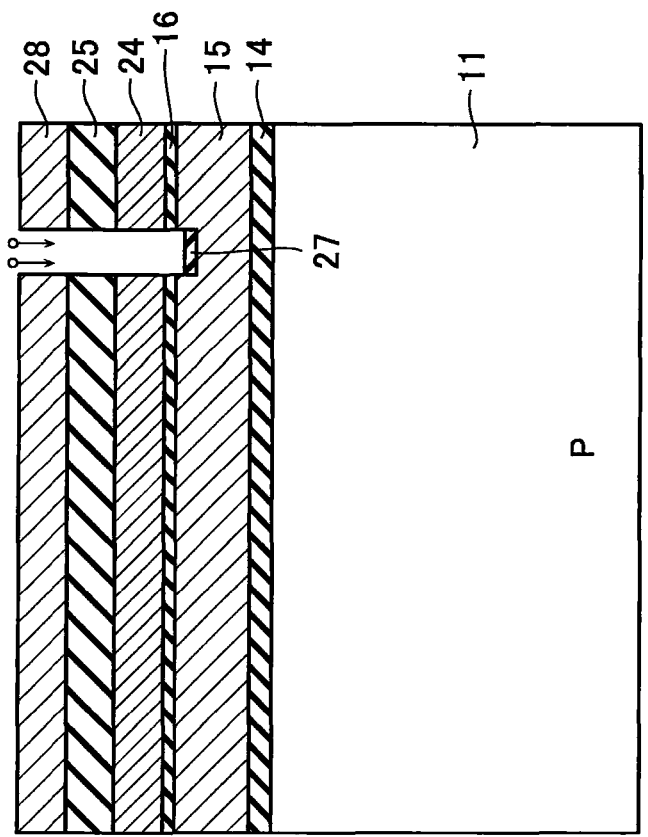
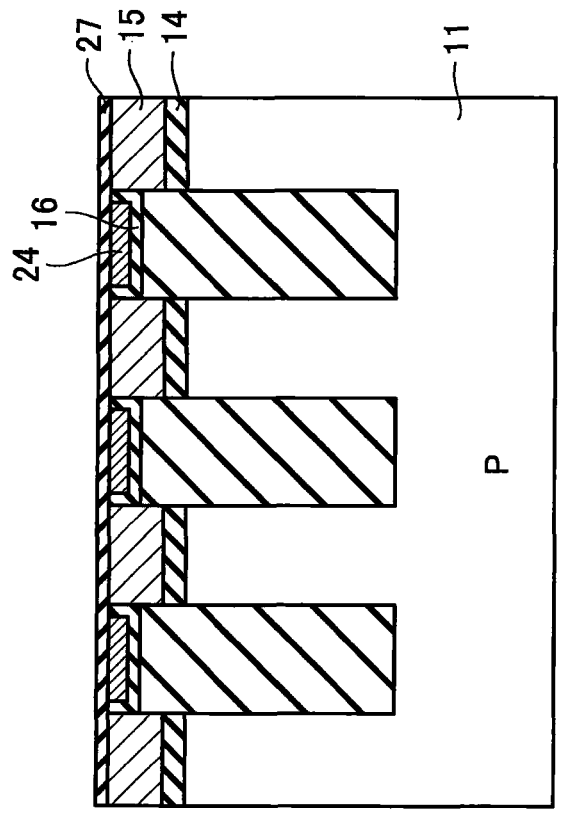

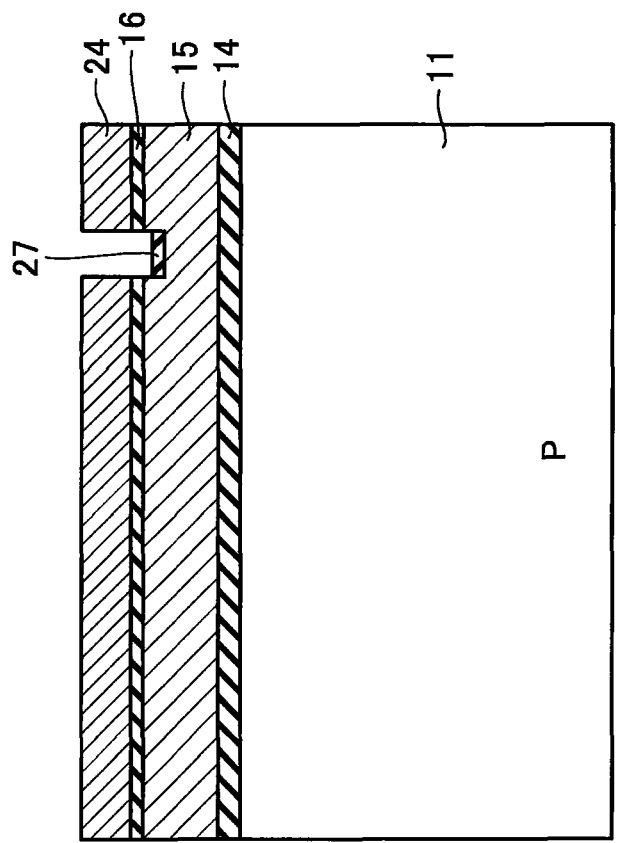
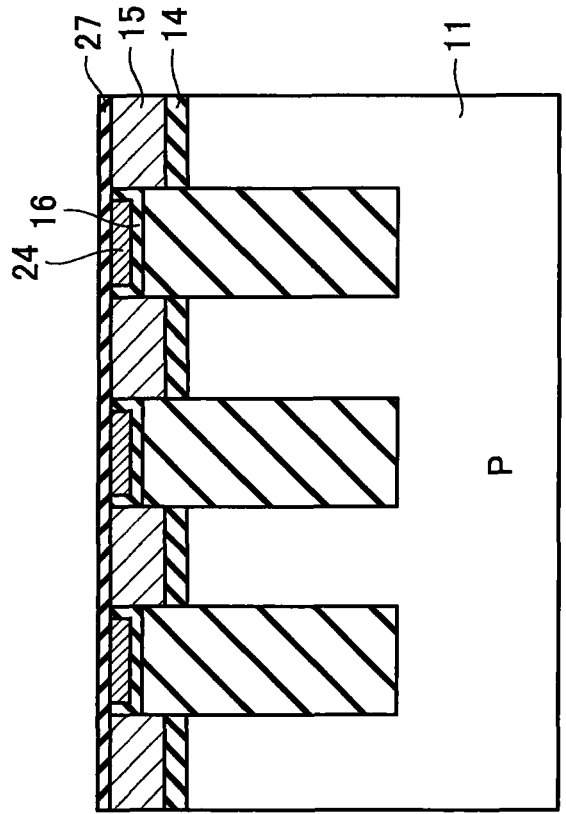
FIG. 11A
FIG. 11B

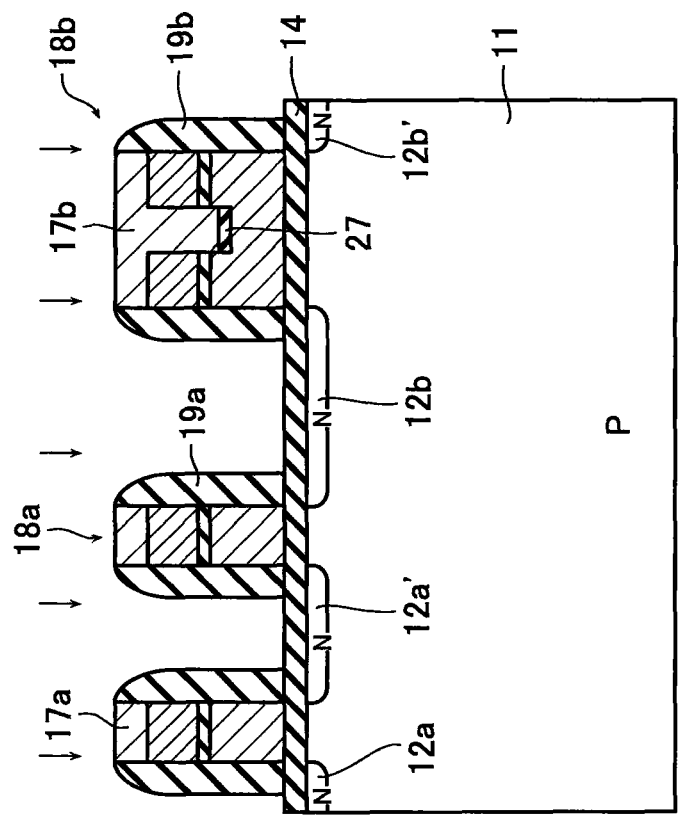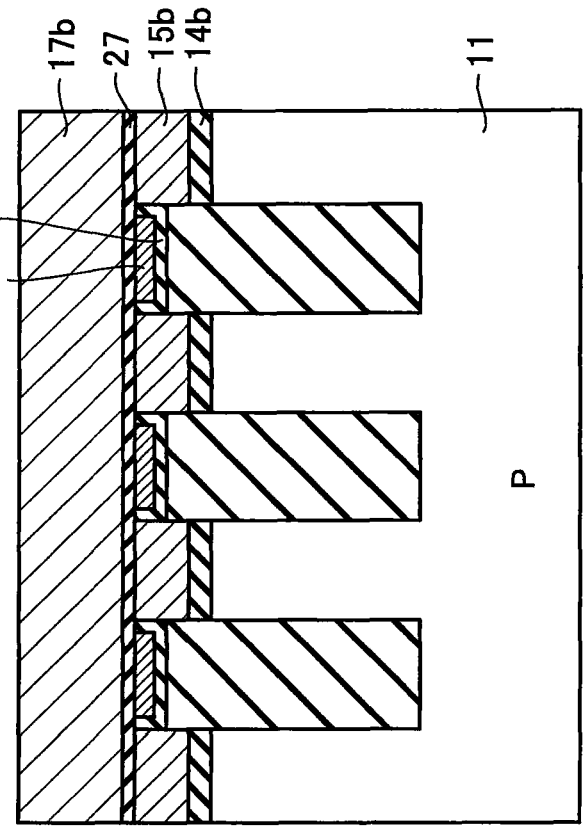

SEMICONDUCTOR MEMORY DEVICE AND METHOD OF MANUFACTURING THE SAME

CROSS-REFERENCE TO RELATED APPLICATION

This application is based on and claims the benefit of priority from prior Japanese Patent Application No. 2007-303640, filed on Nov. 22, 2007, the entire contents of which are incorporated herein by reference.

BACKGROUND OF THE INVENTION

1. Field of the Invention

The present invention relates to a semiconductor memory device and method of manufacturing the same, and more particularly to a structure of a stacked-gate nonvolatile semiconductor memory and method of manufacturing the same.

2. Description of the Related Art

A NAND-type flash memory is well known as one of nonvolatile semiconductor memories. Such the NAND-type flash memory comprises a semiconductor substrate on which memory cells and selection transistors are formed together with peripheral circuits required for memory operation. A memory cell may include a floating gate composed of conductive polysilicon formed on the semiconductor substrate with a gate insulator interposed, and a control gate composed of conductive polysilicon formed on the floating gate with an intergate insulator interposed.

On the other hand, the selection transistors and the transistors in the peripheral circuits are formed through process steps in accordance with formation of the memory cells. The transistors may include a lower gate composed of conductive polysilicon formed on the semiconductor substrate with the gate insulator interposed, and an upper gate composed of conductive polysilicon formed thereon with an insulator interposed.

In this way, the NAND-type flash memory comprises a stacked-gate nonvolatile semiconductor memory having a plurality of gates stacked with insulators interposed.

As for the selection transistors and the transistors in the peripheral circuits, it is required to cause an electrical short circuit between the upper gate and the lower gate in accordance with formation of memory cells such that they can serve as transistors. The electrical short circuit may be caused with an aperture formed through part of the intergate insulator between the upper gate and the lower gate.

If the transistor has a gate length of 50 nm or below on the other hand, the gate resistance increases and causes problems associated with lack of the voltage applied to the gate and the signal speed delay. These problems may be solved by a full silicide structure including the entire gate silicided as proposed (see, for example, JP 2005-228868A).

Such the full silicide structure may be applied to the above-described stacked-gate nonvolatile semiconductor memory. In this case, together with fully siliciding the control gate, the upper gate of the selection transistor is also fully silicided. When the upper gate is fully silicided, metal atoms can diffuse into the lower gate via the aperture formed through the insulator between the upper gate and the lower gate, thereby siliciding part of the lower gate electrode as well.

At this time, if the lower gate electrode part is excessively silicided and the siliciding progresses to the vicinity of the gate insulator, there is concern that metal atoms may diffuse into the gate insulator.

In that case, the operating characteristics of the transistor, such as the threshold of the selection transistor, may vary and make it difficult to maintain stable transistor operation.

SUMMARY OF THE INVENTION

In an aspect the present invention provides a semiconductor memory device, comprising a plurality of transistors having a stacked-gate structure, each transistor including a semiconductor substrate, a gate insulator formed on the semiconductor substrate, a lower gate formed on the semiconductor substrate with the gate insulator interposed, an intergate insulator formed on the lower gate, and an upper gate formed and silicided on the lower gate with the intergate insulator interposed, a portion of the transistors having an aperture formed through the intergate insulator to connect the lower gate with the upper gate and further including a silicide suppression region between the aperture and the gate insulator to suppress diffusion of metal atoms from the silicided upper gate.

In another aspect the present invention provides a semiconductor memory device, comprising: a plurality of memory cells, each including: a semiconductor substrate, a gate insulator formed on the semiconductor substrate, a lower gate serving as a floating gate formed on the semiconductor substrate with the gate insulator interposed, an intergate insulator formed on the lower gate, and an upper gate serving as a control gate formed and silicided on the lower gate with the intergate insulator interposed; and a plurality of transistors formed together with the memory cells, each transistor including: the semiconductor substrate, the gate insulator, the lower gate, the intergate insulator, and the upper gate, the transistor having an aperture formed through the intergate insulator to connect the lower gate with the upper gate and further including a silicide suppression region between the aperture and the gate insulator to suppress diffusion of metal atoms from the silicided upper gate.

In yet another aspect the present invention provides a method of manufacturing a semiconductor memory device, comprising: forming a gate insulator above a semiconductor substrate; forming a first conductive film above the gate insulator; forming an intergate insulator above the first conductive film; selectively forming an aperture by etching through the intergate insulator in part of a region for use in formation of a transistor, and forming a trench in the first conductive film below the aperture by etching the first conductive film partway; selectively forming a silicide suppression region in a base of the trench; forming a second conductive film above the intergate insulator; selectively removing the second conductive film, the intergate insulator and the first conductive film by etching to form gates of memory cells and the transistor; and siliciding the second conductive film by depositing a siliciding metal on the second conductive film.

BRIEF DESCRIPTION OF THE DRAWINGS

FIG. 4 is an illustrative view of a method of manufacturing a NAND flash memory according to a first embodiment of the present invention.

FIG. 6 is an illustrative view of the method of manufacturing the NAND flash memory according to the first embodiment of the present invention.

FIG. 7 is an illustrative view of the method of manufacturing the NAND flash memory according to the first embodiment of the present invention.

FIG. 10 is an illustrative view of the method of manufacturing the NAND flash memory according to the first embodiment of the present invention.

FIG. 11 is an illustrative view of the method of manufacturing the NAND flash memory according to the first embodiment of the present invention.

FIG. 14 is an illustrative view of the method of manufacturing the NAND flash memory according to the first embodiment of the present invention.

DETAILED DESCRIPTION OF THE EMBODIMENTS

A semiconductor memory device according to an embodiment of the present invention will now be described with reference to the drawings.

Figure 1:
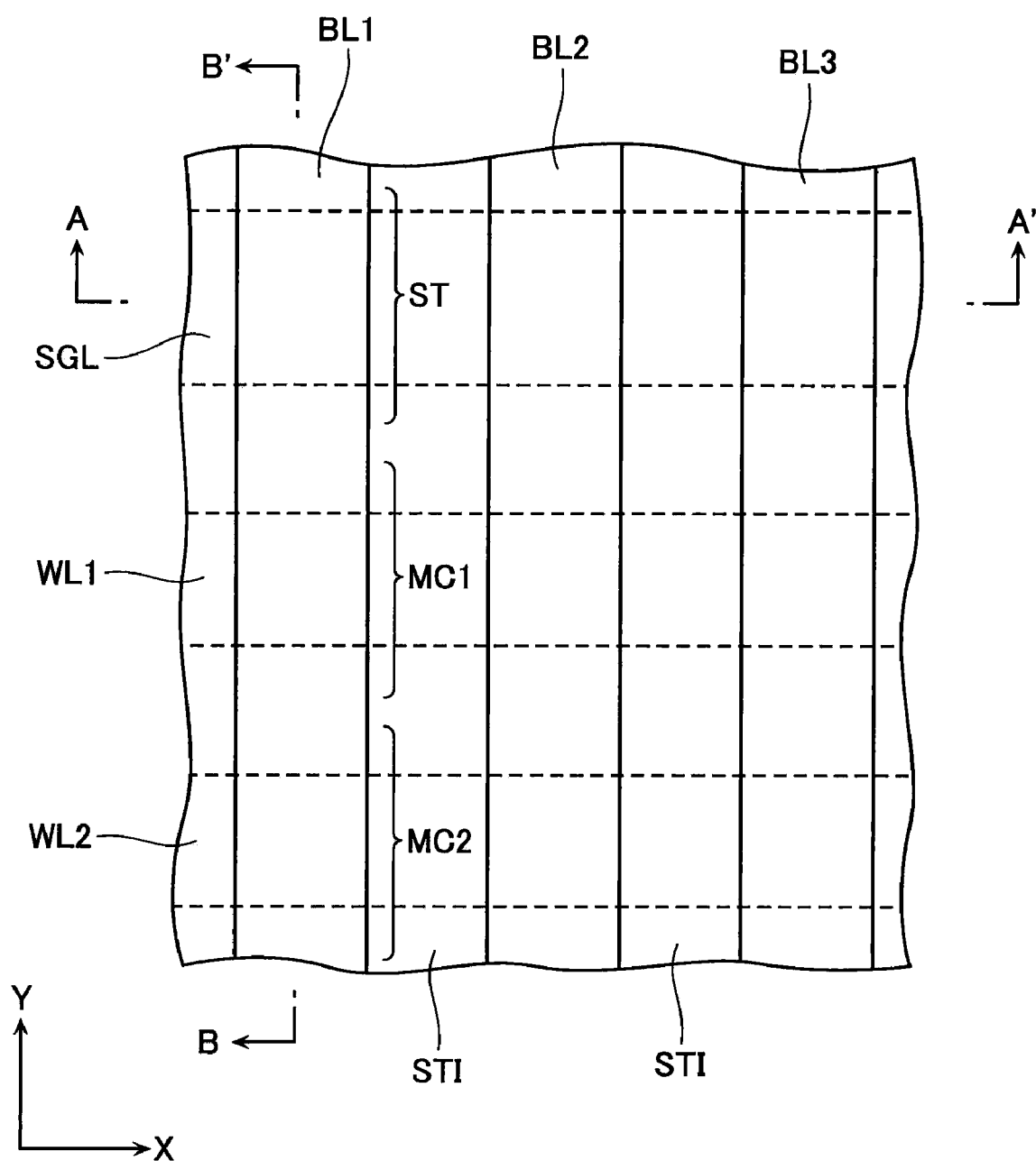
FIG. 1 is a plan view of a memory cell array in a NAND flash memory according to an embodiment of the present invention.

FIG. 1 is a plan view of a cell array area in a NAND flash memory according to the embodiment of the present invention.

The cell array area includes a plurality of bit lines BL (BL1, BL2, BL3, . . . ) extending in the Y-direction in the figure formed therein. Formed in a lower layer than these bit lines BL are a selection gate SGL and a plurality of word lines WL (WL1, WL2, . . . ) extending in the X-direction at right angles to the bit lines BL.

Each memory cell MC is formed below an intersection of the word line WL and the bit line BL and a plurality of such memory cells MC (MC1, MC2, . . . ) are serially connected along the bit line BL direction. Selection transistors ST are formed below an intersection of the selection gates SGL and the bit line BL and connected to both ends of the serially connected memory cells MC. These memory cells MC and the selection transistors ST are isolated from each other in the word line WL direction by STI (Shallow Trench Isolation) extending along the bit line BL direction.

Figure 2:
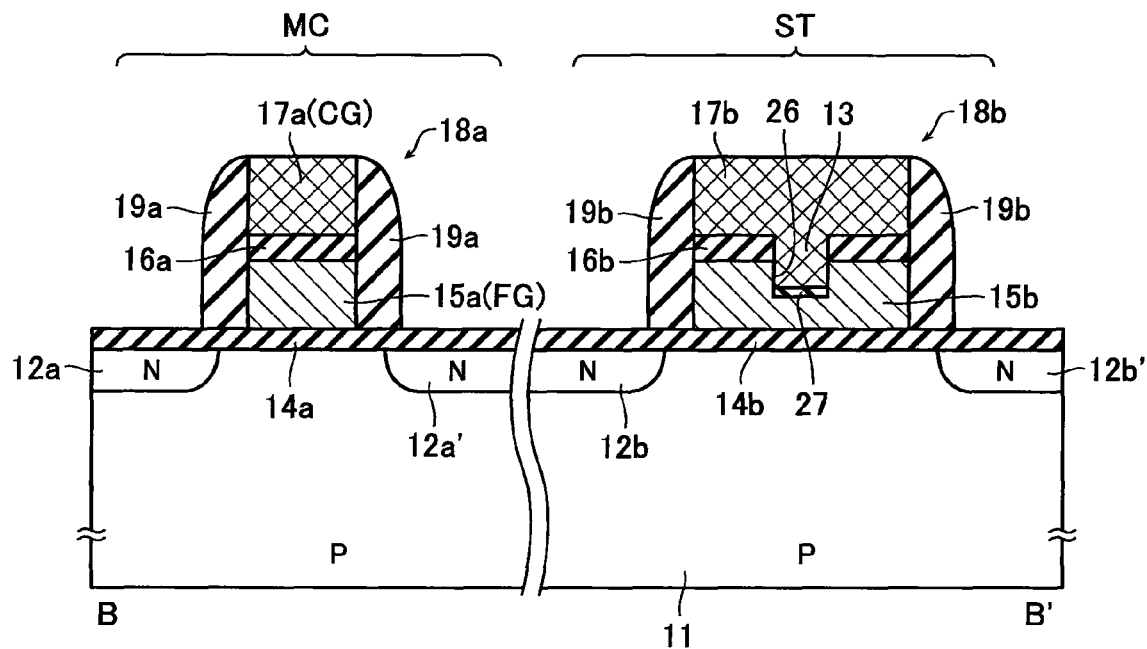
FIG. 2 is a partly omitted view of a B-B' line section of the NAND flash memory according to the embodiment of the present invention.

FIG. 2 shows a partly omitted B-B' line section of the NAND flash memory taken along the bit line BL according to the embodiment of the present invention. The NAND flash memory according to the embodiment comprises the memory cell (MC) and the selection transistor (ST) operative to select or control the memory cell. Note that for convenience of description FIG. 2 does not show interlayer insulators and so on above the gates.

A configuration of the memory cell (MC) is described first. The memory cell includes a P-type silicon substrate 11, and a floating gate (FG) 15a composed of conductive polysilicon doped with an impurity such as phosphorous (P) and formed on the silicon substrate 11 with a gate insulator 14a composed of silicon oxide interposed. In a memory cell adjacent thereto in the word line (WL) direction (a gate width direction), the surface region of the silicon substrate 11, the gate insulator 14a and a lower portion of the floating gate 15a are isolated from others by STI (not shown).

Deposited on the floating gate 15a is a high-permittivity intergate insulator 16a composed of an ONO ($SiO_2$/SiN/$SiO_2$) film with a thickness of about 10 nm. Formed on the intergate insulator 16a is a control gate (CG) 17a, which is silicided after deposition of conductive polysilicon. The control gate 17a has an entirely silicided full silicide structure as described later in detail. The control gate 17a may be composed of a nickel silicide (NiSi), a tungsten silicide (WSi), a tantalum silicide (TaSi), a cobalt silicide (CoSi) or a titanium silicide (TiSi), formed extending in the word line direction and shared by plural memory cells adjoining in the word line direction. Thus, the control gate 17a is stacked above the floating gate 15a with the intergate insulator 16a interposed to configure a gate electrode 18a having a stacked structure.

Formed on the side surface of the gate electrode 18a are sidewalls 19a composed of, for example, a silicon nitride film or a silicon oxide film.

Formed in the upper surface of the P-type silicon substrate 11 are N-type impurity diffused regions 12a and 12a' doped with an impurity such as phosphorous (P) and configured as source or drain, which are formed sandwiching the gate electrode 18a therebetween in a self-aligned manner. The P-type silicon substrate 11 may be a P-type well instead.

A configuration of the selection transistor (ST) is described next. The selection transistor (ST) includes the P-type silicon substrate 11, and a lower gate 15b composed of conductive polysilicon doped with an impurity such as phosphorous (P) and formed on the P-type silicon substrate 11 with a gate insulator 14b composed of silicon oxide interposed.

Deposited on the lower gate 15b is a high-permittivity intergate insulator 16b composed of an ONO ($SiO_2$/SiN/$SiO_2$) film with a thickness of about 10 nm. Formed through the intergate insulator 16b almost at the central portion in the bit line (BL) direction on the upper surface of the lower gate 15b is an aperture 13. Formed on the intergate insulator 16b is an upper gate 17b, which is silicided after deposition of conductive polysilicon. The upper gate 17b has a full silicide structure with the entire gate silicided. The upper gate 17b may be composed of a nickel silicide (NiSi), a tungsten silicide (WSi), a tantalum silicide (TaSi), a cobalt silicide (CoSi) or a titanium silicide (TiSi) formed extending in the word line direction and shared by plural selection transistors adjoining in the word line direction. Thus, the upper gate 17b is stacked above the lower gate 15b with the intergate insulator 16b interposed to configure a gate electrode 18b having a stacked structure.

The upper gate 17b is electrically connected to the lower gate 15b via the above-described aperture 13. Formed directly below the aperture 13 is a trench 26; conductive polysilicon is buried in the trench 26 and silicided. The trench 26 becomes a silicide formation region within the lower gate 15b. Formed in the base of the trench 26 is a silicide suppression region 27 to suppress diffusion of metal atoms from the upper gate 17b to the lower gate 15b. The silicide suppression region 27 is configured as a film or layer composed of at least one of silicon oxide ($SiO_2$), silicon nitride (SiN) and silicon carbide (a carbon-rich film containing a large quantity of carbon). The silicide suppression region 27 is formed directly below the aperture 13 at a depth of between ¼ and ¾ of the film thickness of the lower gate 15b, preferably at a depth of between ⅓ and ⅔ of the film thickness of the lower gate 15b, and even more preferably at a depth of about ½ of the film thickness of the lower gate 15b, extending in the depth direction from the surface of the lower gate 15b; this is to ensure excellent conduction via the aperture 13 connecting the upper gate 17b and the lower gate 15b, while at the same time suppressing excessive diffusion of metal atoms from the upper gate 17b to the lower gate 15b and, in addition, inhibiting metal atoms from reaching the gate insulator 14b.

Figure 3:
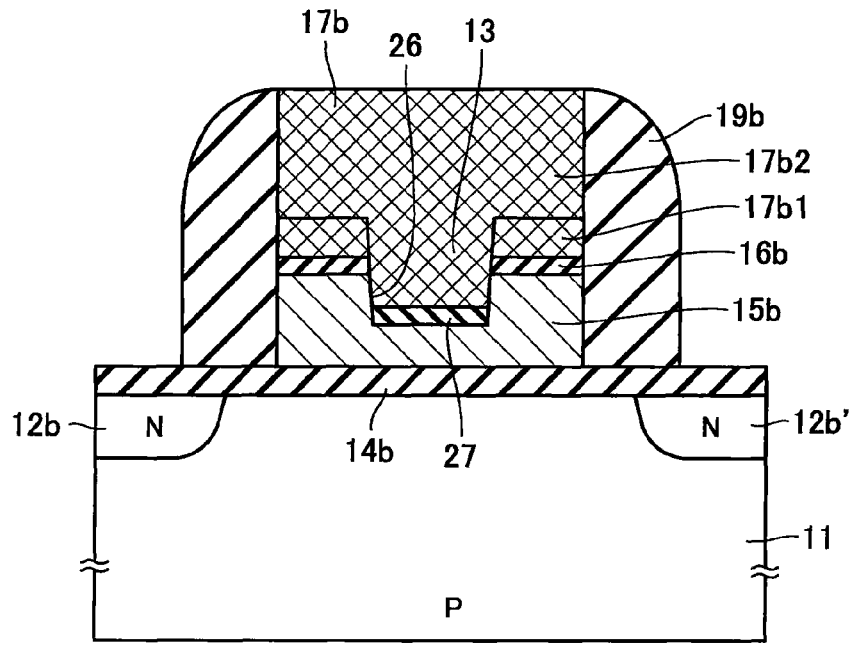
FIG. 3 is an enlarged cross-sectional view of a selection transistor in the NAND flash memory according to the embodiment of the present invention.

Here, the silicide suppression region 27 will be described in greater detail. FIG. 3 shows the selection transistor (ST) of FIG. 2 in enlarged view. A first upper gate 17b1 and a second upper gate 17b2 are stacked in order from below to configure the upper gate 17b. The first upper gate 17b1 and the second upper gate 17b2 are simultaneously silicided to configure the upper gate 17b. Metal atoms from the fully silicided upper gate 17b diffuse into the trench 26 formed in the lower gate 15b via the aperture 13 of the intergate insulator 16b and silicide the conductive polysilicon buried in the trench 26. If diffusion of the metal atoms progresses thereafter, the inside of the lower gate 15b is silicided.

Here, the metal atoms diffusing from the upper gate 17b in the depth direction by way of the aperture 13 cannot diffuse any further in the depth direction than the silicide suppression region 27, due to provision of the silicide suppression region 27 in the base of the trench 26. In this way, diffusion of metal atoms in the depth direction is suppressed. At the same time, there are few metal atoms that diffuse in the depth direction by diffusion from the side surface of the trench 26 in a sideways or diagonally downward direction.

Consequently, the above-mentioned configuration prevents metal atoms from reaching the gate insulator 14b.

Furthermore, siliciding of the lower gate 15b at the side surfaces of the trench 26 ensures that the upper gate 17b and the lower gate 15b are electrically connected through a sufficient contact area.

Formed in the side surfaces of the gate electrode 18b are sidewalls 19b composed of a silicon nitride film or a silicon oxide film.

Formed in the upper surface of the P-type silicon substrate 11 are N-type impurity diffused regions 12b and 12b' doped with an impurity such as phosphorous (P) and respectively forming source and drain, which are formed sandwiching the gate electrode 18b therebetween in a self-aligned manner. The P-type silicon substrate 11 may be a P-type well instead. A channel region is formed directly below the gate insulator 14b between the N-type impurity diffused regions 12b and 12b'.

In the NAND flash memory according to the present embodiment, after fully siliciding the control gate 17a and the upper gate 17b, siliciding of the lower gate 15b through the aperture 13 can be prevented from excessively progressing to allow metal atoms to diffuse into the gate insulator 14b. In addition, a sufficient contact area to electrically short the upper gate 17b and the lower gate 15b can be ensured and a contact resistance can be sufficiently lowered. As a result, it is possible to provide a NAND flash memory with high reliability.

In the above embodiment the configuration of the selection transistor ST is described though transistors Tr in peripheral circuits can be configured similarly.

First Embodiment of Manufacturing Method

A first embodiment associated with a method of manufacturing the above-described NAND flash memory is described in detail with reference to the drawings. FIGS. 4-15 illustrate process steps of manufacturing the NAND flash memory according to the present embodiment. Note that (A) schematically shows a part of a sectional view taken along line A-A' of the cell array area shown in FIG. 1 and (B) schematically shows a part of a sectional view taken along line B-B' of the cell array area shown in FIG. 1.

In step 1, the surface of the semiconductor substrate 11 such as a silicon substrate is subjected to thermal oxidation to form the gate insulator 14 composed of silicon oxide with a film thickness of 10 nm as shown in FIG. 4. Then, a process of CVD is applied to deposit a first conductive polysilicon film 15 doped with phosphorous (P) at a certain concentration with a thickness of 100 nm.

Thereafter, a process of CVD is applied to deposit a silicon nitride film 21 with a film thickness of 50 nm. Subsequently, a resist is applied to the entire surface and a mask 22 formed by photolithography technology. Then, an anisotropic etching such as RIE is executed using the mask 22 to form a trench 23. The trench 23 is for forming an element isolation insulating layer of an STI structure, as explained below.

Figure 5A:
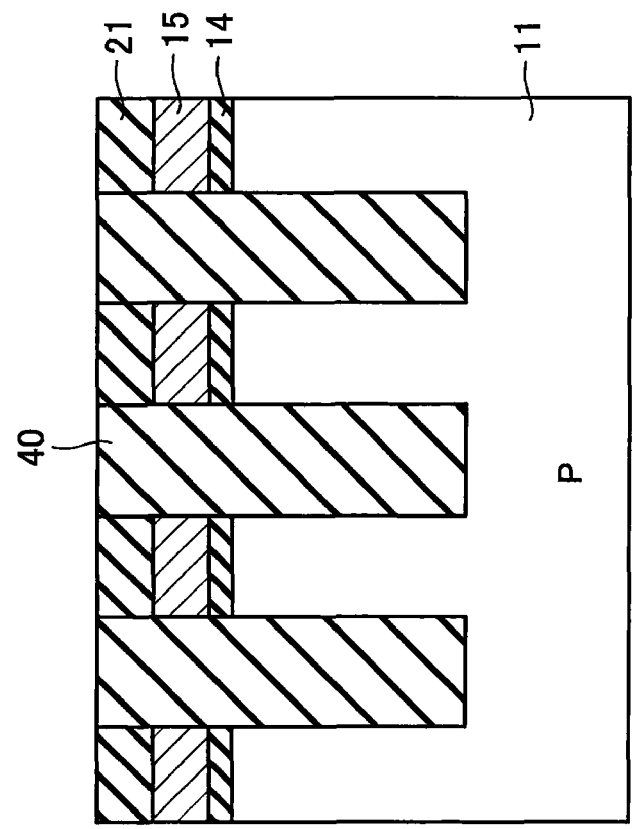
FIG. 5 is an illustrative view of the method of manufacturing the NAND flash memory according to the first embodiment of the present invention.
Figure 5B:
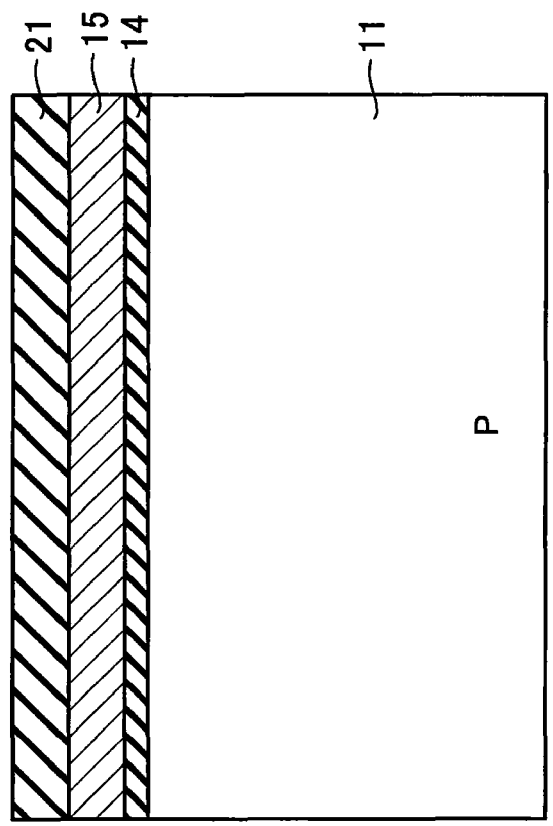

In step 2, the mask 22 is removed, after which a process of plasma CVD is applied to deposit a silicon oxide film 40 such as a TEOS film and fill up the inside of the trench 23 therewith as shown in FIG. 5. Thereafter, the entire surface is planarized by a process of CMP with the silicon nitride film 21 as a stopper film.

In step 3, the silicon oxide film 40 is etched back by wet etching or dry etching with the silicon nitride film 21 as a mask to form an element isolation insulating layer 41 of an STI structure as shown in FIG. 6. Here, DHF (dilute hydrofluoric acid) may be used as the wet etchant for the wet etching. In addition, the dry etching may be RIE.

In step 4, the silicon nitride film 21 is removed by dry etching such as RIE as shown in FIG. 7. Thereafter, processes of CVD are applied to sequentially deposit an intergate insulator 16 such as an ONO ($SiO_2$/SiN/$SiO_2$) film, a polysilicon film 24 with a thickness of 50 nm, and a silicon oxide film 25 such as a TEOS film with a thickness of 150 nm. Note that the polysilicon film 24 subsequently becomes the above-described first upper gate 17b1 in the enlarged view of FIG. 3.

Figure 8A:
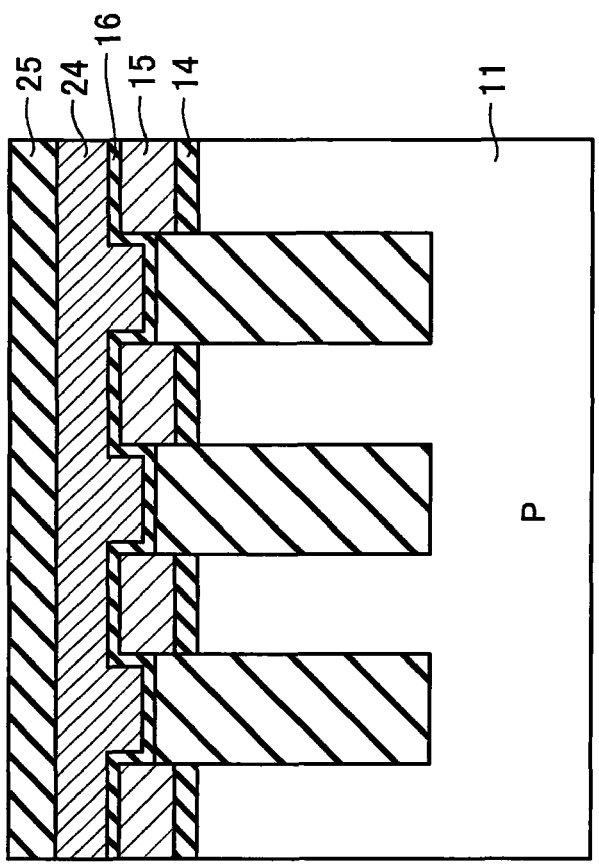
FIG. 8 is an illustrative view of the method of manufacturing the NAND flash memory according to the first embodiment of the present invention.
Figure 8B:
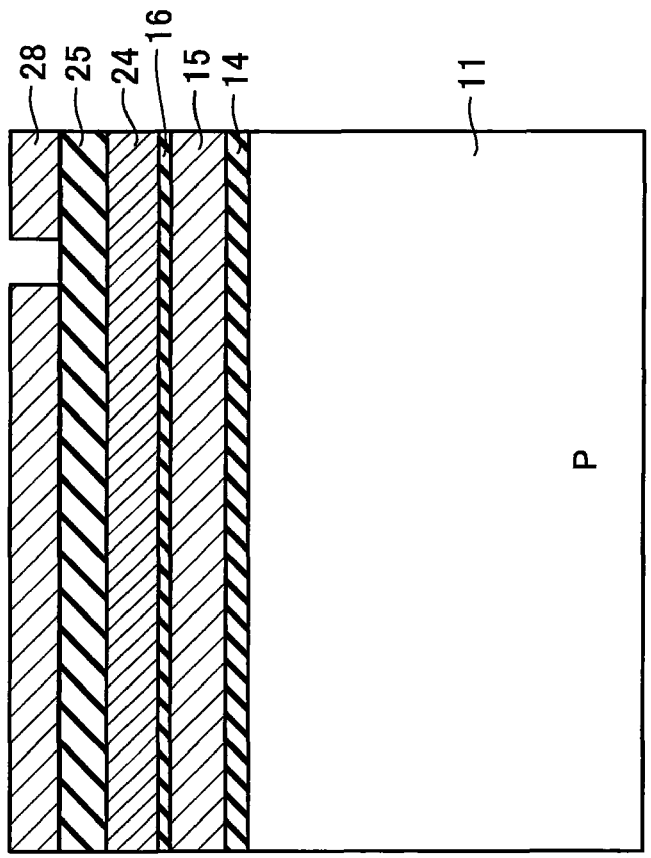

In step 5, a resist is applied on the silicon oxide film 25 and photolithography technology used to form a mask 28 having an opening in the region for use in formation of the above-described trench 26 as shown in FIG. 8.

Figure 9B:
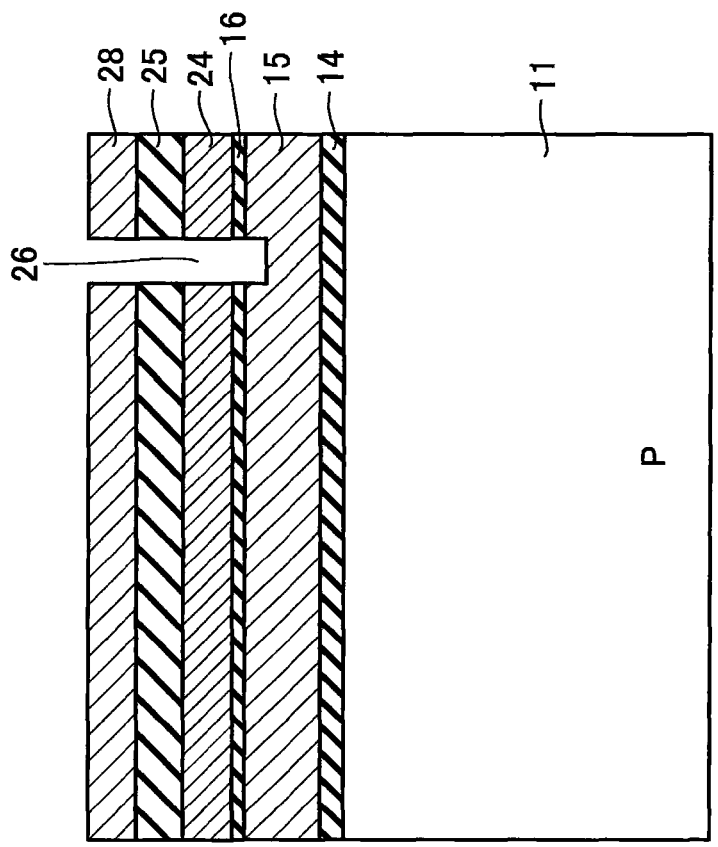
FIG. 9 is an illustrative view of the method of manufacturing the NAND flash memory according to the first embodiment of the present invention.
Figure 9A:
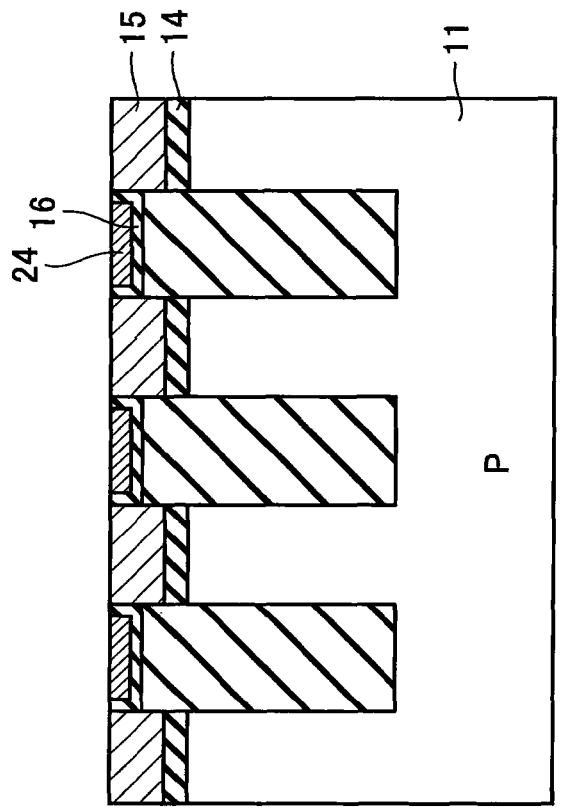

In step 6, the silicon oxide film 25 is selectively removed by dry etching such as RIE using the mask 28 as shown in FIG. 9. Then, an anisotropic etching such as RIE is executed as far as partway into the first polysilicon film 15 with the silicon oxide film 25 as a hard mask, thereby selectively forming a trench 26 (this is similarly applied to the transistors in peripheral circuits). At this time, the etching is controlled so that a bottom surface of the trench 26 does not reach the gate insulator 14.

In step 7, an anisotropic plasma processing is effected by such as an RIE apparatus using gases such as $N_2$, $O_2$, CO and $CH_4$ and the configurative elements of the plasma gas are driven into the base only of the trench 26, thereby forming a silicide suppression region 27 configured as a film or layer selectively containing N, C, O and so on and composed of at least one of a silicon oxide, a silicon nitride and a silicon carbide (a silicide containing many carbon atoms) in the base of the trench 26 as shown in FIG. 10.

In step 8, the mask 28 and the silicon oxide film 25 are removed by wet etching using such as DHF as shown in FIG. 11.

Figure 12A:
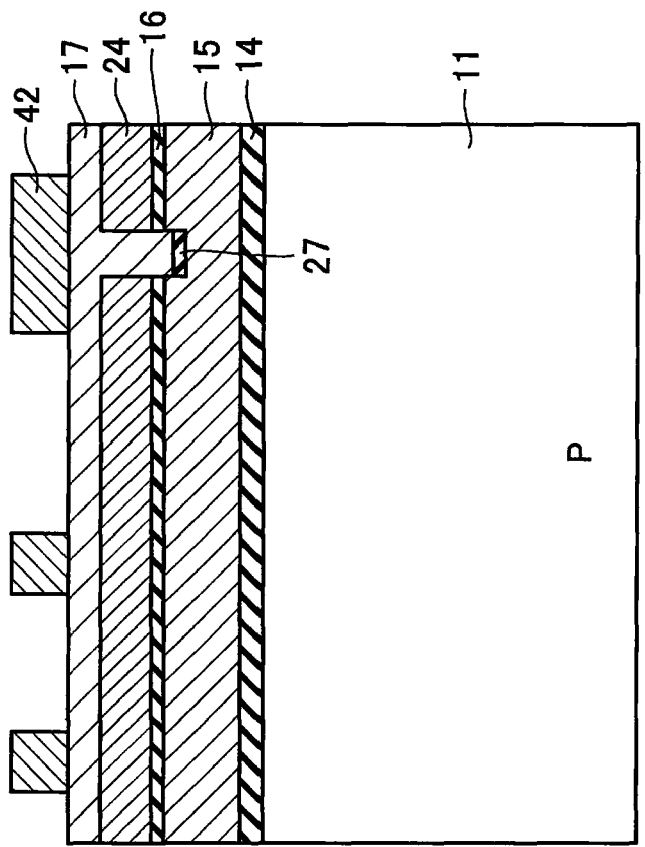
FIG. 12 is an illustrative view of the method of manufacturing the NAND flash memory according to the first embodiment of the present invention.
Figure 12B:
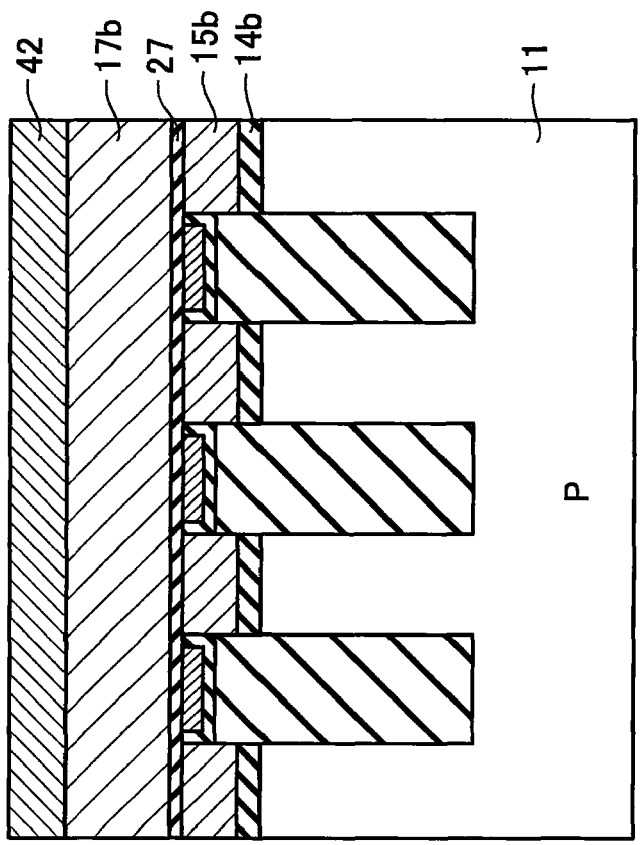

In step 9, a process of CVD is applied to deposit a second polysilicon film 17 with a thickness of 100 nm as shown in FIG. 12. Note that the second polysilicon film 17 subsequently becomes the above-described second upper gate 17b2 in the enlarged view of FIG. 3. Thereafter, a photoresist is applied over the entire surface, followed by patterning to form a mask 42 that covers the region for use information of the gate electrode 18a and the gate electrode 18b.

Figure 13B:
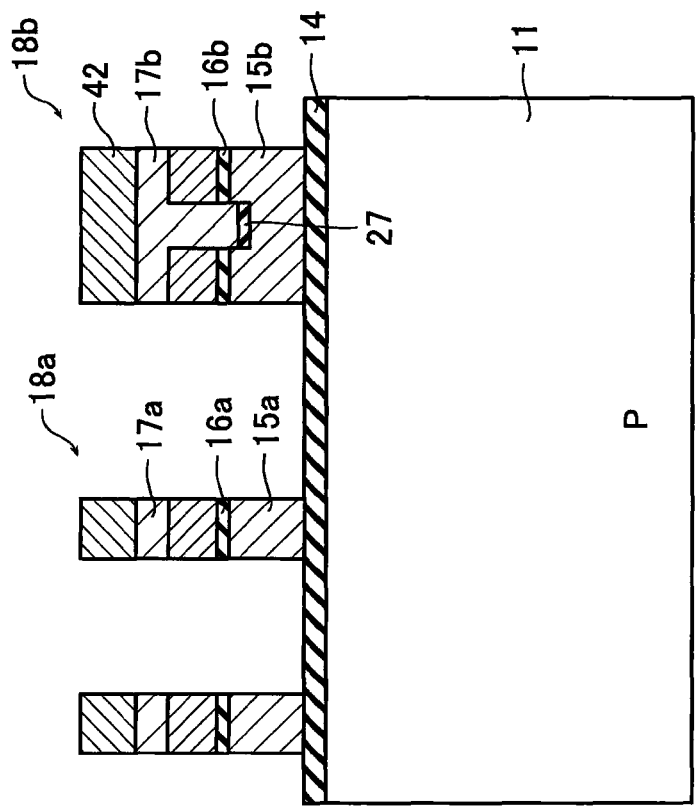
FIG. 13 is an illustrative view of the method of manufacturing the NAND flash memory according to the first embodiment of the present invention.
Figure 13A:
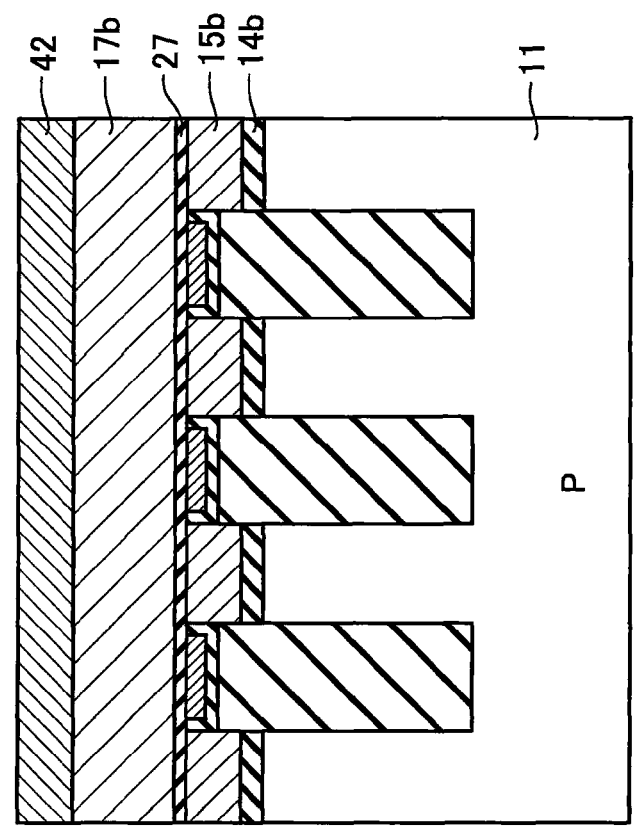

In step 10, an anisotropic etching such as RIE is executed using the mask 42 to selectively form the gate electrode 18a and the gate electrode 18b as shown in FIG. 13. Thereafter, the mask 42 is removed.

In step 11, a silicon nitride film or a silicon oxide film is deposited then subsequently etched back to form sidewalls 19a and 19b on the respective sides of the gate electrode 18a and the gate electrode 18b as shown in FIG. 14. Then, ions of phosphorus (P) are implanted at a concentration of $1\times10^{18}$ $cm^{-3}$ in the upper surface of the semiconductor substrate 11 with sidewalls 19a and 19b serving as masks in a self-aligned manner to form N-type impurity diffused regions 12a, 12b, 12a' and 12b'.

Figure 15A:
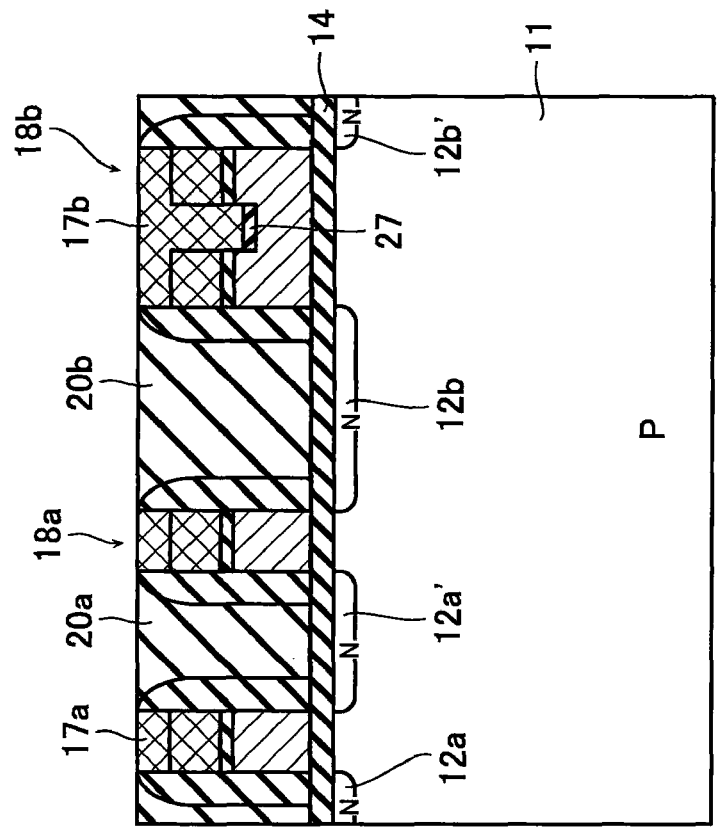
FIG. 15 is an illustrative view of the method of manufacturing the NAND flash memory according to the first embodiment of the present invention.
Figure 15B:
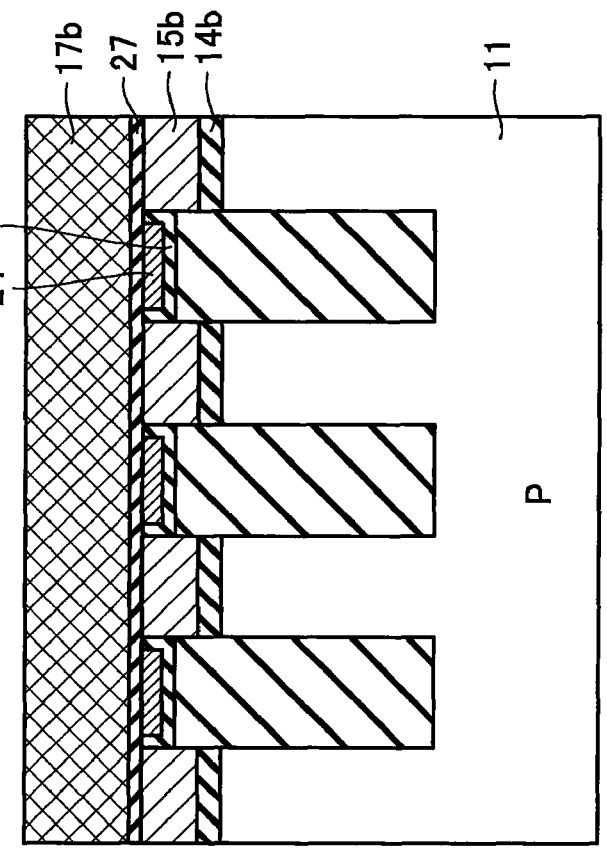

In step 12, a process of plasma CVD is applied to deposit an interlayer insulator such as a TEOS film over the entire surface and fill up between the gate electrode 18a and the gate electrode 18b therewith as shown in FIG. 15. Thereafter, the surface is planarized by a process of CMP to form gate isolation layers 20a and 20b. At this time, the sidewalls 19a and 19b function as stopper films. The gate isolation layer 20a electrically isolates the gate electrodes 18a of the memory cells from each other and the gate isolation layer 20b electrically isolates the gate electrode 18a of the memory cell and the gate electrode 18b of the selection transistor.

Finally, in step 13, a sputtering method is used to deposit atoms of a metal such as nickel (Ni) over the entire surface. Thereafter, an annealing process is applied to react Ni with polysilicon in the control gate 17a and the upper gate 17b to form nickel silicide, thereby fully siliciding the control gate 17a and the upper gate 17b. The method of fully siliciding is not limited to this example.

In accordance with the manufacturing method according to the present embodiment, a silicide suppression region 27 is formed in the base of the trench 26 connecting the upper gate 17b and the lower gate 15b of the transistor, so that diffusion of metal atoms from the fully silicided upper gate 17b to the lower gate 15b is inhibited and diffused metal atoms are prevented from reaching the gate insulator 14b. As a result, it is possible to ensure stable operation of transistors.

Second Embodiment of Manufacturing Method

Figure 16B:
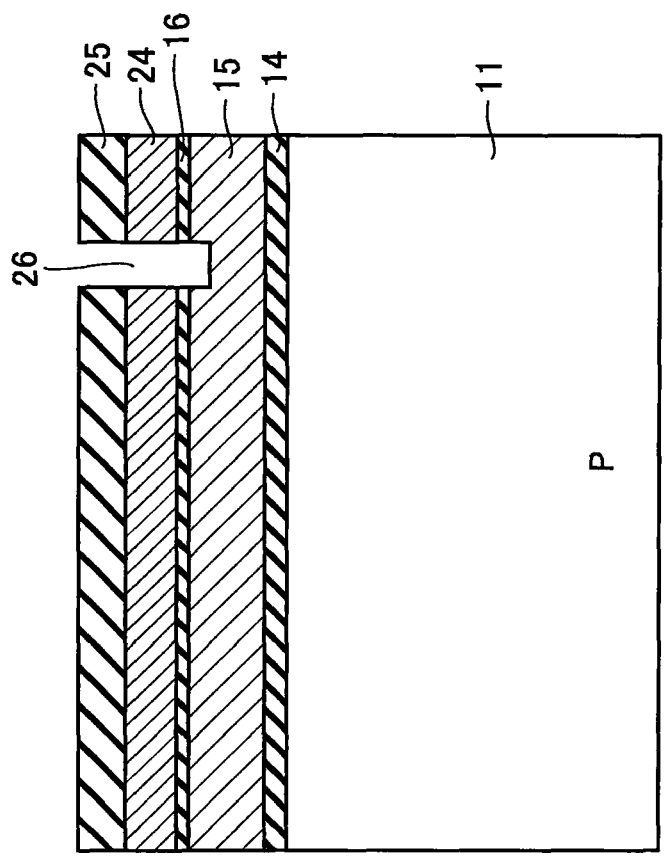
FIG. 16 is an illustrative view of a method of manufacturing a NAND flash memory according to a second embodiment of the present invention.
Figure 16A:
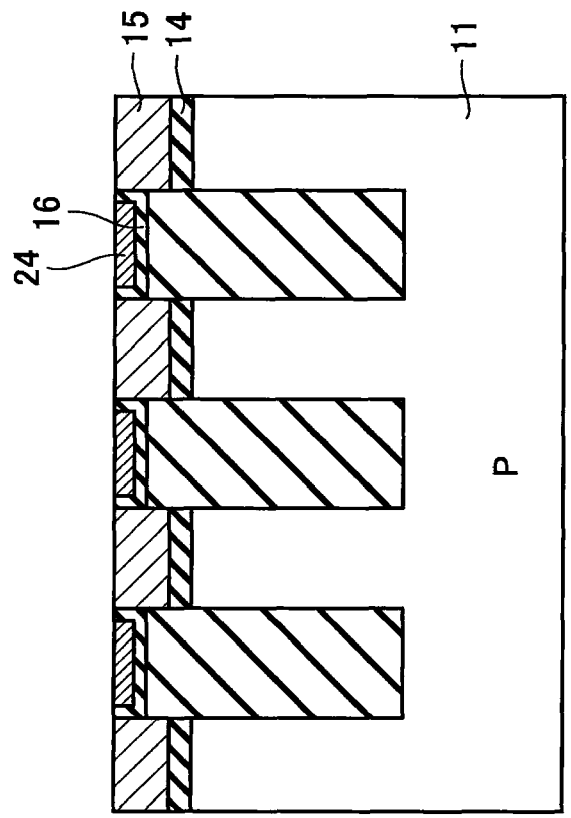
Figure 17A:
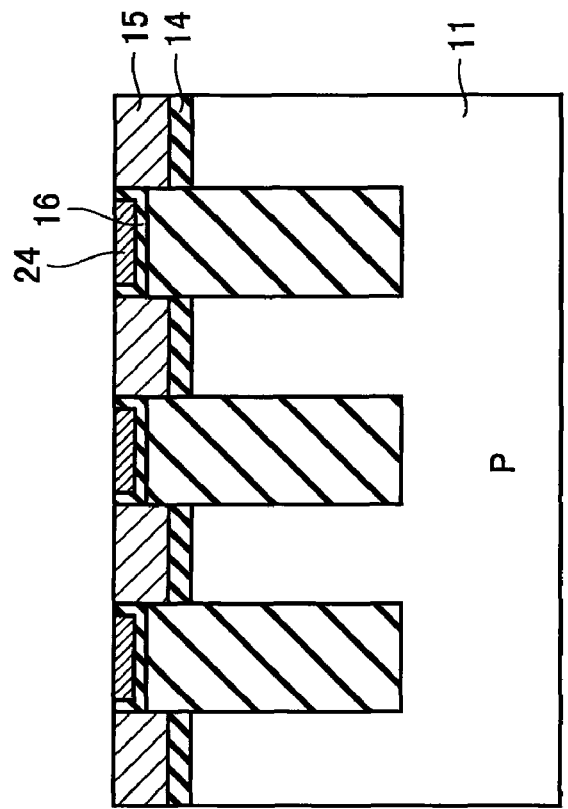
FIG. 17 is an illustrative view of the method of manufacturing the NAND flash memory according to the second embodiment of the present invention.
Figure 17B:
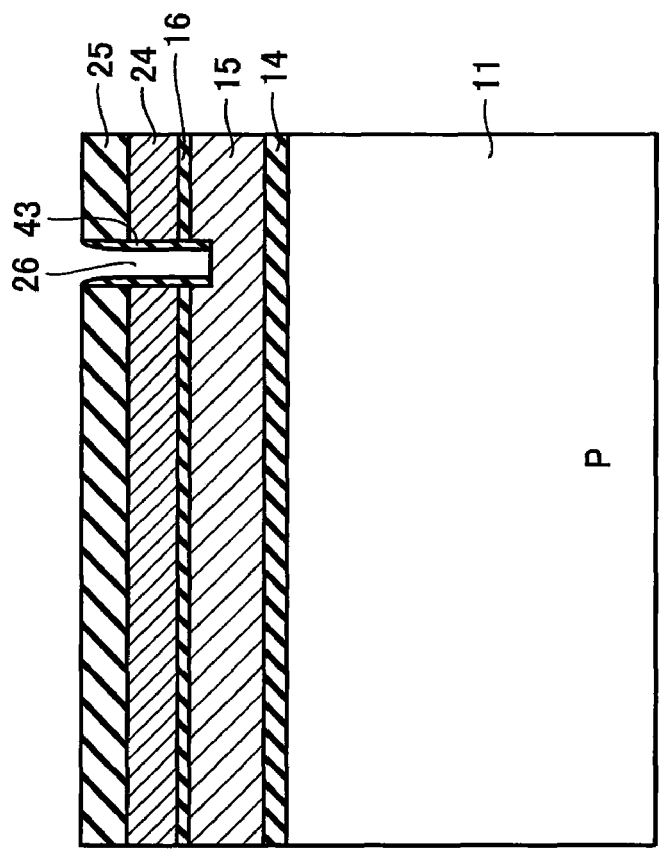
Figure 18A:
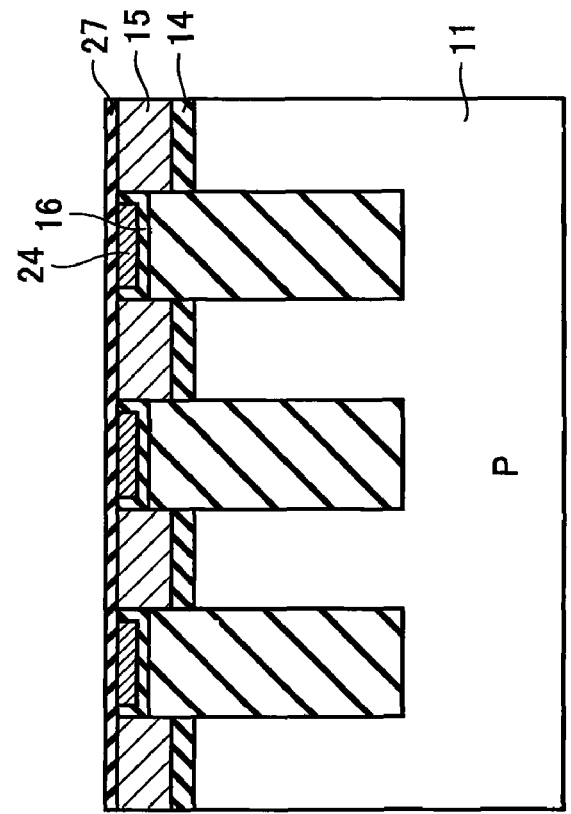
FIG. 18 is an illustrative view of the method of manufacturing the NAND flash memory according to the second embodiment of the present invention.
Figure 18B:
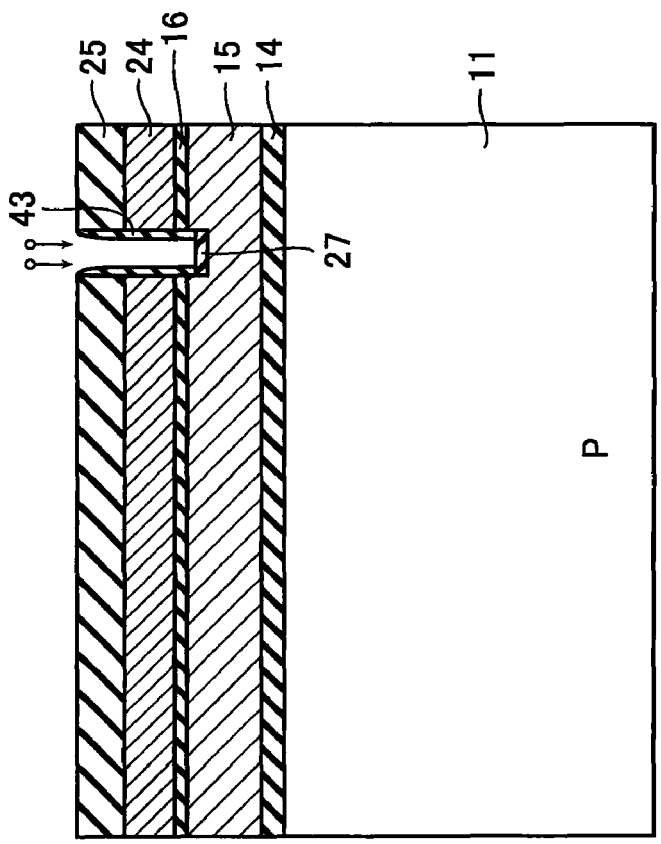

Next, a second embodiment associated with a method of manufacturing a NAND flash memory is described in detail with reference to the drawings. FIGS. 16-18 illustrate process steps of manufacturing the NAND flash memory according to the second embodiment. The second embodiment differs from the above-described first embodiment only in step 7 where the silicide suppression region is formed. Steps other than step 7 are identical to those of the above-described first embodiment, and a description thereof is thus omitted.

In the previous embodiment, the silicide suppression region 27 containing N, C, O and so on was formed in the base only of the trench 26 by RIE or the like with the side surfaces of the trench 26 exposed; however, in the present embodiment, sidewalls are formed in the trench 26 prior to forming the silicide suppression region 27, so as to prevent changes in composition of the side surfaces of the trench 26.

After forming the trench 26 in step 6 described in relation to FIG. 9, the mask 28 is removed as shown in FIG. 16.

Subsequently, a process of CVD is applied to deposit a silicon oxide film such as a TEOS film with a thickness of 20 nm as shown in FIG. 17. Thereafter, the silicon oxide film is etched back to form sidewalls 43 in the inner side surfaces of the trench 26.

Next, an oxidation or nitridation processing is applied to the base only of the trench 26 to form the silicide suppression region 27 composed of a film or layer of a silicon oxide or a silicon nitride as shown in FIG. 18. An RIE apparatus or the like may be used instead to drive carbon atoms (C) into the base only of the trench 26 using gases such as CO or $CH_4$ and form the silicon suppression region 27 as a C-rich layer with a high concentration of carbon.

Subsequently, a processing of wet etching is effected to remove the sidewalls 43 on the inside of the trench 26 together with the silicon oxide film 25 as shown in FIG. 11.

In accordance with the manufacturing method according to the present embodiment, a silicide suppression region 27 is formed in the base of the trench 26 connecting the upper gate 17b and the lower gate 15b of the transistor, so that diffusion of metal atoms from the fully silicided upper gate 17b to the lower gate 15b is inhibited and diffused metal atoms are prevented from reaching the gate insulator 14b. As a result, it is possible to ensure stable operation of transistors.

Others

The embodiments of the invention have been described above though the present invention is not limited to these embodiments but rather can be given various modifications and additions without departing from the scope and spirit of the invention. For example, the NAND flash memory is described in the above embodiments though the present invention is also applicable to other stacked-gate nonvolatile memories such as a NOR flash memory.

What is claimed is:
1. A semiconductor memory device, comprising:
a plurality of transistors having a stacked-gate structure, each transistor including:
a semiconductor substrate,
a gate insulator formed on said semiconductor substrate,
a lower gate formed on said semiconductor substrate with said gate insulator interposed,
an intergate insulator formed on said lower gate, and
an upper gate formed and silicided on said lower gate with said intergate insulator interposed,
wherein at least one of said transistors further includes:
an aperture formed through said intergate insulator to connect said lower gate with said upper gate, a silicide suppression region between said aperture and said gate insulator to suppress diffusion of metal atoms from said silicided upper gate, and a silicide formation region provided in a first portion of said lower gate below said aperture, a side surface of said silicide formation region in said lower gate being in direct contact with a second portion of said lower gate and being electrically connected to said second portion of said lower gate, and said silicide suppression region being formed in a base of said silicide formation region.

2. The semiconductor memory device according to claim 1, wherein metal atoms in said silicided upper gate are not diffused into said gate insulator through said aperture.

3. The semiconductor memory device according to claim 1, wherein said aperture is formed almost at the center of an upper surface of said lower gate and wherein said silicide suppression region is formed directly below said aperture.

4. The semiconductor memory device according to claim 1, wherein said silicide suppression region is formed from at least one of silicon oxide, silicon nitride and silicon carbide.

5. The semiconductor memory device according to claim 1, wherein said silicide suppression region is formed at a depth of between ¼ and ¾ of the film thickness of the lower gate.

6. The semiconductor memory device according to claim 1, wherein said silicide suppression region is formed at a depth of between ⅓ and ⅔ of the film thickness of the lower gate.

7. The semiconductor memory device according to claim 1, wherein said silicide suppression region is formed at a depth of approximately ½ of the film thickness of the lower gate.

8. A semiconductor memory device, comprising:
a plurality of memory cells, each including:
a semiconductor substrate,
a gate insulator formed on said semiconductor substrate,
a lower gate serving as a floating gate formed on said semiconductor substrate with said gate insulator interposed,
an intergate insulator formed on said lower gate, and
an upper gate serving as a control gate formed and silicided on said lower gate with said intergate insulator interposed; and
a plurality of transistors formed together with said memory cells, each transistor including:
said semiconductor substrate,
said gate insulator,
said lower gate,
said intergate insulator,
said upper gate,
an aperture formed through said intergate insulator to connect said lower gate with said upper gate,
a silicide suppression region between said aperture and said gate insulator to suppress diffusion of metal atoms from said silicided upper gate, and
a silicide formation region provided in a first portion of said lower gate below said aperture, a side surface of said silicide formation region in said lower gate being in direct contact with a second portion of said lower gate and being electrically connected to said second portion of said lower gate, and said silicide suppression region being formed in a base of said silicide formation region.

9. The semiconductor memory device according to claim 8, wherein metal atoms in said silicided upper gate of said transistor are not diffused into said gate insulator through said aperture.

10. The semiconductor memory device according to claim 8, wherein said aperture is formed almost at the center of an upper surface of said lower gate and wherein said silicide suppression region is formed directly below said aperture.

11. The semiconductor memory device according to claim 8, wherein said silicide suppression region is formed from at least one of silicon oxide, silicon nitride and silicon carbide.

12. The semiconductor memory device according to claim 8, wherein said silicide suppression region is formed at a depth of between ¼ and ¾ of the film thickness of the lower gate.

13. The semiconductor memory device according to claim 8, wherein said silicide suppression region is formed at a depth of between ⅓ and ⅔ of the film thickness of the lower gate.

14. The semiconductor memory device according to claim 8, wherein said silicide suppression region is formed at a depth of approximately ½ of the film thickness of the lower gate.

* * * * *